(12) United States Patent
Tseng et al.

(10) Patent No.: US 12,323,104 B2
(45) Date of Patent: Jun. 3, 2025

(54) VOLTAGE CONTROL DEVICE

(71) Applicant: MEDIATEK Inc., Hsin-Chu (TW)

(72) Inventors: Wei-Che Tseng, Hsinchu (TW);
Chen-Yen Ho, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 527 days.

(21) Appl. No.: 17/718,453

(22) Filed: Apr. 12, 2022

(65) Prior Publication Data

US 2022/0345088 A1 Oct. 27, 2022

Related U.S. Application Data

(60) Provisional application No. 63/178,631, filed on Apr. 23, 2021.

(51) Int. Cl.
| | | |
|---|---|---|
| *H03F 3/04* | (2006.01) | |
| *H03F 1/02* | (2006.01) | |
| *H03F 3/189* | (2006.01) | |
| *H03F 3/20* | (2006.01) | |

(52) U.S. Cl.
CPC .......... *H03F 1/0227* (2013.01); *H03F 3/189* (2013.01); *H03F 3/20* (2013.01); *H03F 1/0211* (2013.01); *H03F 2200/102* (2013.01); *H03F 2200/297* (2013.01); *H03F 2200/451* (2013.01)

(58) Field of Classification Search
CPC .......... H03F 1/0227; H03F 3/189; H03F 3/20; H03F 2200/102; H03F 2200/297; H03F 2200/451; H03F 3/19; H03F 3/245; H03F 1/0216; H03F 3/04; H03F 1/0244; H03F 1/0211; H03F 2200/504; H03G 3/3042; H03G 3/004

USPC .................................................. 330/127, 297
See application file for complete search history.

(56) References Cited

U.S. PATENT DOCUMENTS

| | | | |
|---|---|---|---|
| 9,263,991 B2* | 2/2016 | Khlat | H03F 1/0261 |
| 10,153,741 B2* | 12/2018 | Yang | H03F 3/245 |
| 10,784,820 B2* | 9/2020 | Yang | H03F 3/195 |
| 2014/0273897 A1* | 9/2014 | Drogi | H04B 1/0458 |
| | | | 455/127.3 |
| 2022/0311388 A1* | 9/2022 | Tahara | H03F 1/56 |

OTHER PUBLICATIONS

Kang, et al.: "Envelope-Tracking Two-Stage Power Amplifiers"; Proceedings of the 41st European Microwave Conference; 978-2-87487-022-4 © 2011 EuMA; Oct. 10-13, 2011, Manchester, UK; pp. 1205-1208.
TW Office Action dated Oct. 12, 2022 in Taiwan application No. 111114677.

* cited by examiner

*Primary Examiner* — Khanh V Nguyen
(74) *Attorney, Agent, or Firm* — McClure, Qualey & Rodack, LLP

(57) ABSTRACT

The disclosure provides a voltage control device for controlling supply voltages of a power amplifier (PA). The voltage control device includes a first processing circuit to provide a first supply voltage to at least one driving stage amplifier of the PA, and a second processing circuit to provide a second supply voltage to an output stage amplifier of the PA. The first supply voltage is generated according to an average-power-tracking (APT) mechanism related to an average power level of a radio frequency (RF) signal transmitted by the PA.

18 Claims, 10 Drawing Sheets

VOLTAGE CONTROL DEVICE

This application claims the benefit of U.S. provisional application Ser. No. 63/178,631, filed Apr. 23, 2021, the subject matter of which is incorporated herein by reference.

TECHNICAL FIELD

The disclosure is relate to a voltage control device, and more particularly, related to a voltage control device for controlling supply voltages of a power amplifier (PA) in a transmitting (TX) front end.

BACKGROUND

As progress of the communication technology, wireless transmission become a must function for a mobile device. Furthermore, to perform wireless transmission, the power amplifier (PA) is a must element for the transmitting (TX) front end. The PA serves to amplify power level of radio frequency (RF) signal to suit the operation condition in wireless environment.

Considering manufacturing factors and element characteristics, parasitic capacitances may appear interior or exterior to the PA. Such parasitic capacitances may seriously degrade signal integrality of the RF signal transmitted by the PA.

To address the aforementioned signal integrality issue of the PA, skilled ones in this technical field are devoted to improve configuration and operating mechanism for the PA, in order to achieve better signal integrality for the RF signal.

SUMMARY

According to one aspect of the present disclosure, a voltage control device is provided. The voltage control device controls supply voltages of a power amplifier (PA). The voltage control device includes a first processing circuit to provide a first supply voltage to at least one driving stage amplifier of the PA, and a second processing circuit to provide a second supply voltage to an output stage amplifier of the PA. The first supply voltage is generated according to an average-power-tracking (APT) mechanism related to an average power level of a radio frequency (RF) signal transmitted by the PA.

According to another aspect of the present disclosure, a power amplifying system is provided. The power amplifying system includes a power amplifier having at least one driving stage amplifier and an output stage amplifier, a first processing circuit to generate a first supply voltage according to an average-power-tracking (APT) mechanism and provide the first supply voltage to the at least one driving stage amplifier, and a second processing circuit to generate a second supply voltage according to an envelope-tracking-supply-modulation (ETSM) mechanism and provide the second supply voltage to the output stage amplifier.

Figure 1:
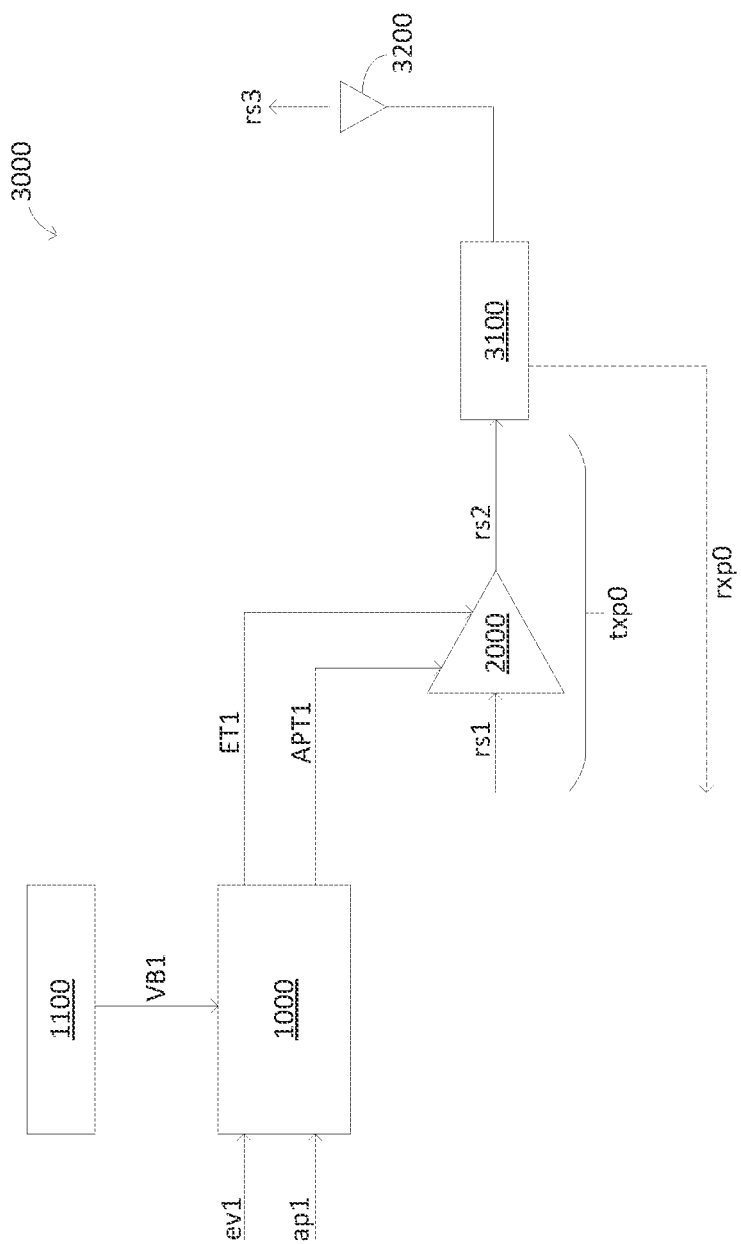
FIG. 1 is a schematic block diagram of a transmitting (TX) front end 3000 which includes a voltage control device 1000 of an example of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically illustrated in order to simplify the drawing.

DETAILED DESCRIPTION

FIG. 1 is a schematic block diagram of a transmitting (TX) front end 3000 which includes a voltage control device 1000 of an example of the present disclosure. Referring to FIG. 1, the TX front end 3000 includes a power source 1100, a voltage control device 1000, a power amplifier (PA) 2000, a switch circuit 3100 and an antenna 3200. The TX front end 3000 functions to transmit radio frequency (RF) signal for an electronic device in a wireless manner.

The PA 2000 receives a modulated RF signal rs1 from a modulator (not shown in FIG. 1), and the RF signal rs1 has a desired operating frequency suitable for wireless transmission. The PA 2000 serves to amplify the power level of the RF signal rs1, obtaining a RF signal rs2 with desired power level suitable for operating condition of the electronic device. The switch circuit 3100 serves to selectively couple the TX path txp0 or the receiving (RX) path rxp0 to the antenna 3200. When the electronic device operates to transmit, the RF signal rs2 is transmitted to the antenna 3200 through the TX path txp0 and the switch circuit 3100. The antenna 3200 serves to generate a radiation signal rs3 according to the RF signal rs2.

The PA 2000 operates with at least two DC supply voltages: a supply voltage APT1 and a supply voltage ET1, in which the PA 2000 is powered according to the supply voltages APT1 and ET1. The voltage levels of the supply voltages APT1 and ET1 are not fixed, but can be dynamically adjusted according to current condition the electronic device operates. For an operating condition the RF signal rs2 needs to be amplified as a greater power level, the supply voltages APT1 and ET1 may be adjusted as a greater voltage level, otherwise, voltage level of the supply voltages APT1 and ET1 may be lowered.

The voltage control device 1000 serves to provide the supply voltages APT1 and ET1 and adjust voltage levels thereof. The power source 1100 serves to provide a supply voltage VB1 to the voltage control device 1000. The supply voltage VB1 is a fixed supply voltage with a fixed voltage level. In one example, the power source 1100 refers to a battery, and the supply voltage VB1 is a fixed battery voltage of 1.5 volts.

More particularly, the supply voltage APT1 may be referred to as "the first supply voltage", and the voltage control device 1000 may control the supply voltage APT1 according to an "average-power-tracking (APT)" mechanism. Furthermore, the supply voltage ET1 may be referred to as "the second supply voltage", which may be controlled according to an "envelope-tracking-supply-modulating (ETSM)" mechanism.

Figure 2A:
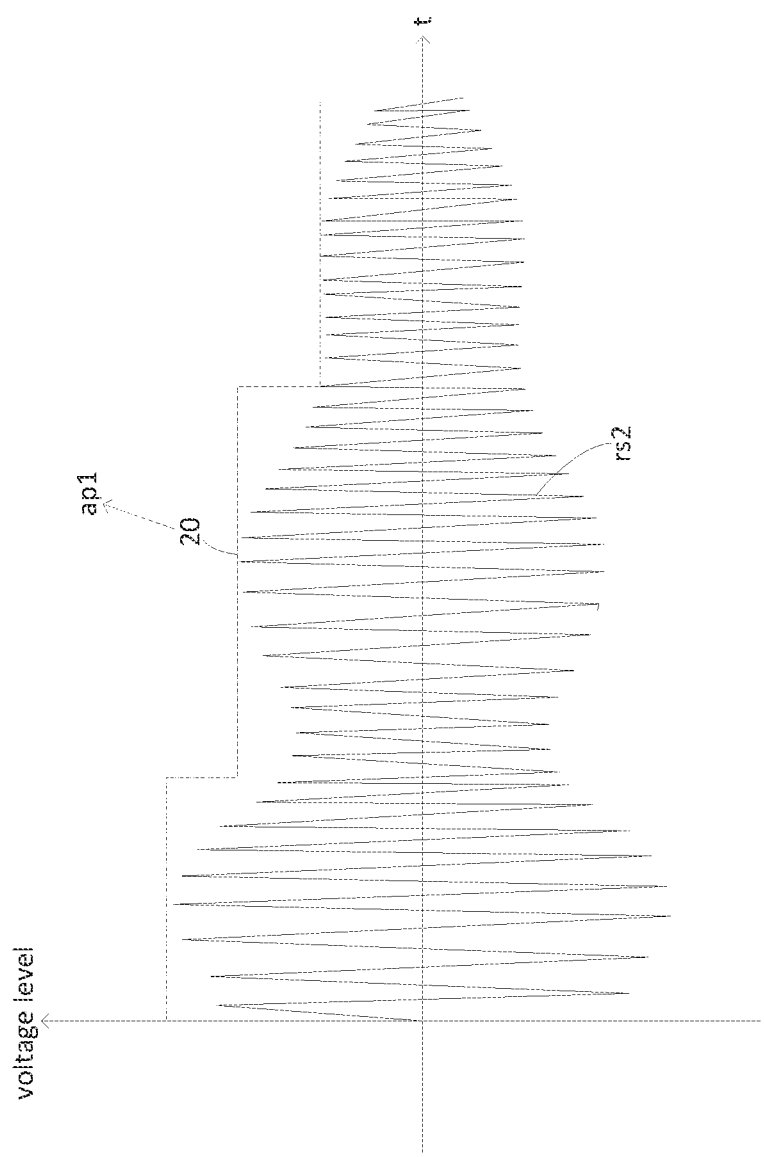
FIG. 2A is a diagram of voltage level of the RF signal versus time.
Figure 2B:
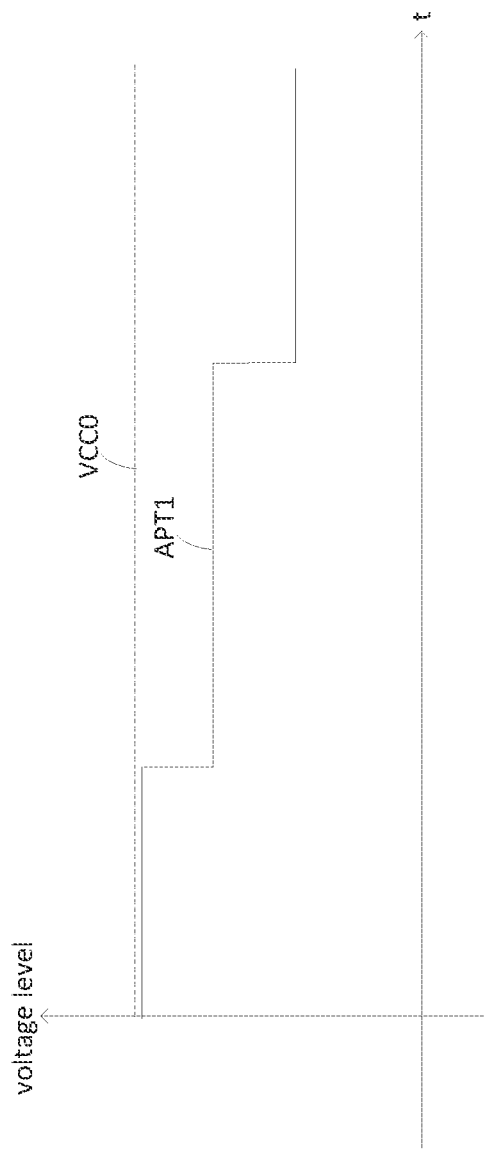
FIG. 2B is a diagram of voltage level of the supply voltage versus time.

FIG. 2A is a diagram of voltage level of the RF signal rs2 versus time, and FIG. 2B is a diagram of voltage level of the supply voltage APT1 versus time, both of which illustrate the APT mechanism performed to the supply voltage APT1. Referring to FIG. 2A, the average power level 20 of the RF signal rs2 may be measured, and a control signal ap1 related to the average power level 20 may be obtained. The voltage control device 1000 may be configured to adjust the supply voltage APT1 according to the control signal ap1. When the average power level 20 of the RF signal rs2 decreases, indicating that the PA 2000 requires less supply power, hence the voltage control device 1000 lowers voltage level of the supply voltage APT1, as shown in FIG. 2B. Compared with a fixed supply voltage VCC0, the supply voltage APT1 may be dynamically adjusted according to the average power level 20 of the RF signal rs2, so that power dissipation by the PA 2000 may be reduced.

Figure 3A:
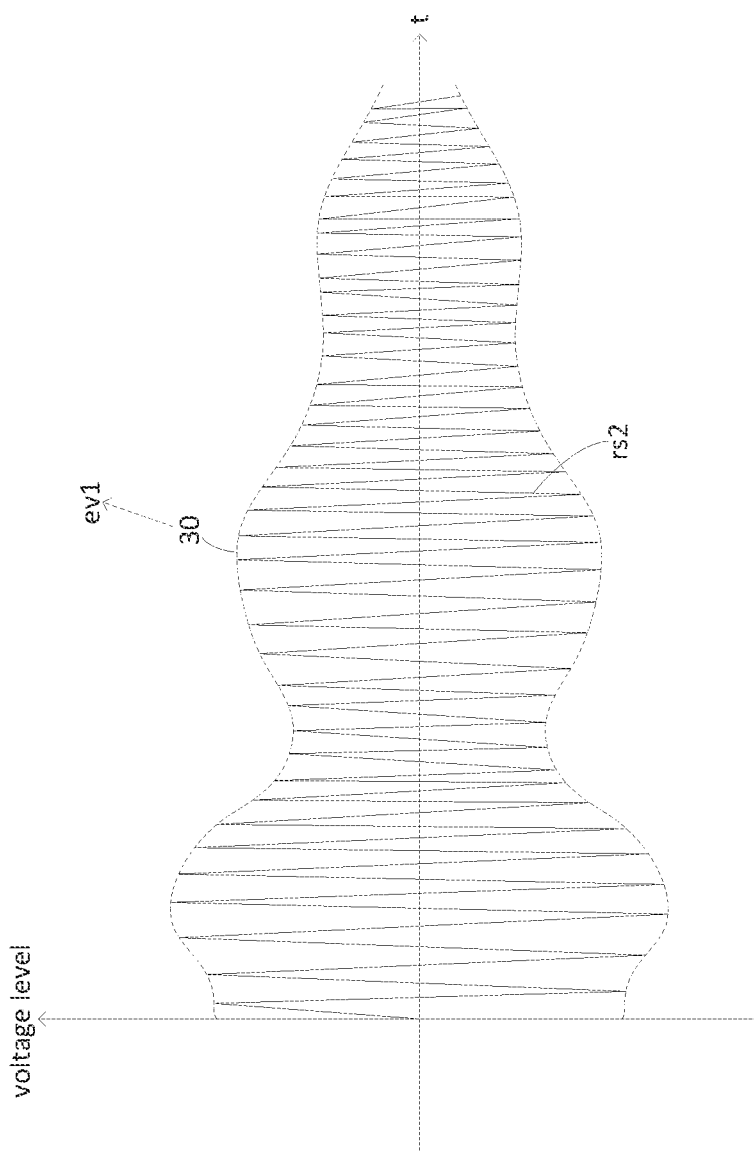
FIG. 3A is another diagram of voltage level of the RF signal versus time.
Figure 3B:
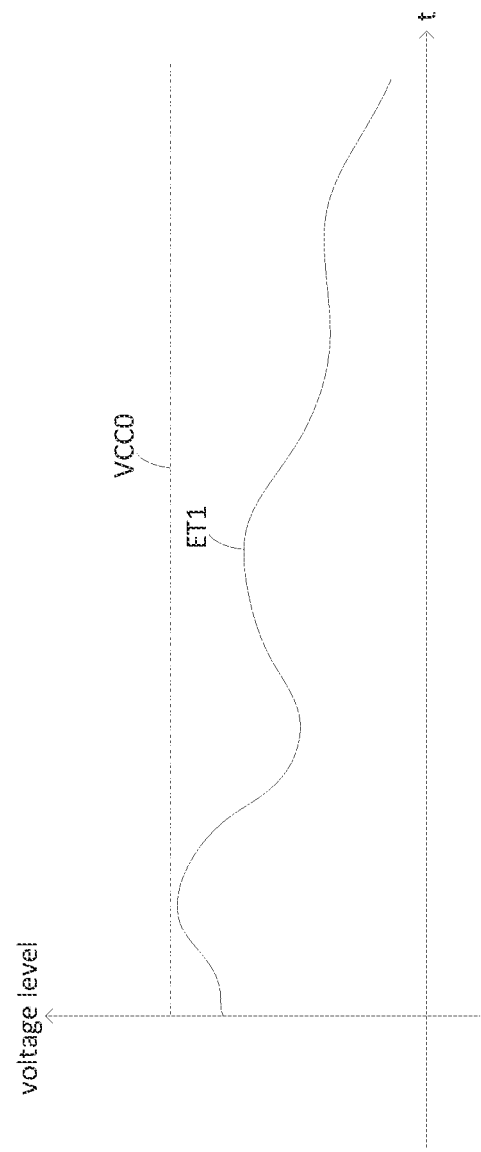
FIG. 3B is a diagram of voltage level of the supply voltage versus time.

On the other hand, with the ETSM mechanism, the supply voltage ET1 is "constantly" (i.e., more frequently and precisely) adjusted according to the envelope of the RF signal rs2, thus the PA 2000 may further reduce its power dissipation. FIG. 3A is another diagram of voltage level of the RF signal rs2 versus time, and FIG. 3B is a diagram of voltage level of the supply voltage ET1 versus time, both of which illustrate the ETSM mechanism performed to the supply voltage ET1. Referring to FIG. 3A, envelope 30 of the RF signal rs2 may be measured, and a control signal ev1 related to the envelope 30 is obtained. According to the control signal ev1, the voltage control device 1000 may be configured to "constantly" adjust the supply voltage ET1 as shown in FIG. 3B. In the ETSM mechanism, voltage level of the RF signal rs2 may be tracked more precisely, hence the supply voltage ET1 may be immediately adjusted to further reduce power dissipation of the PA 2000.

In the example of FIG. 1, the average power level 20 and envelope 30 of the RF signal rs2 are measured by a separated element (not shown in FIG. 1) other than the voltage control device 1000, and the control signals ap1 and ev1 may be generated in such a separated element. In other examples (not shown in FIG. 1), the voltage control device 1000 may serve to measure the average power level 20 and envelope 30 of the RF signal rs2, and the control signals ap1 and ev1 may be internally generated by the voltage control device 1000.

The supply voltage ET1 may be of analog type or digital type. In one example, the supply voltage ET1 is an analog modulated supply voltage referred to as "supply voltage AET1". In another example, the supply voltage ET1 is a digital modulated supply voltage referred to as "supply voltage DET1".

Figure 4:
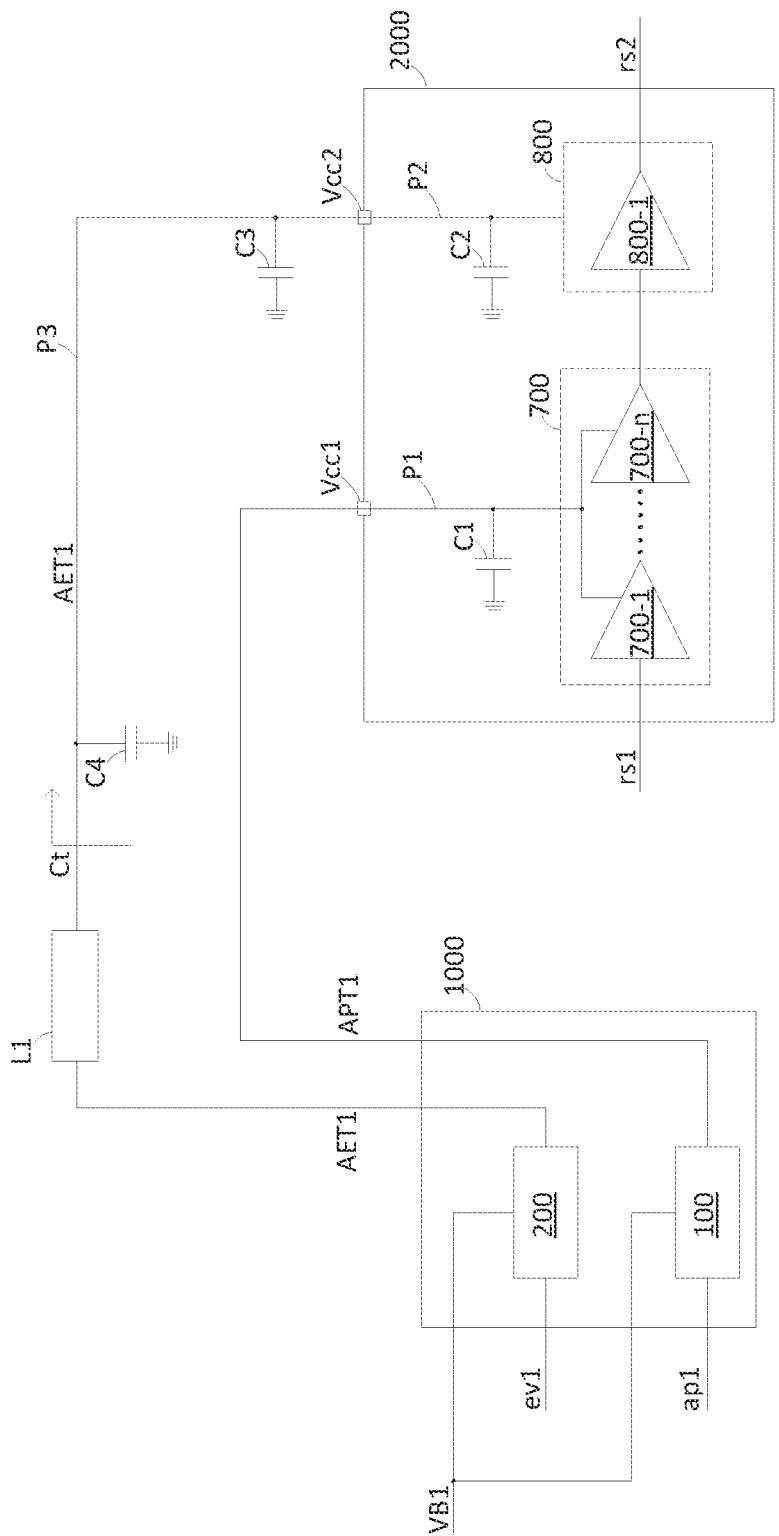
FIG. 4 is a schematic block diagram illustrating the voltage control device and the PA of an example of the present disclosure.

FIG. 4 is a schematic block diagram illustrating the voltage control device 1000 and the PA 2000 of an example of the present disclosure. In the example of FIG. 4, the voltage control device 1000 provides a supply voltage AET1 which is an analog modulated supply voltage. Referring to FIG. 4, the voltage control device 1000 includes a processing circuit 100 and a processing circuit 200. The processing circuit 100, which may be referred to as "the first processing circuit", serves to provide the supply voltage APT1 according to the control signal ap1 and the supply voltage VB1. In one example, the processing circuit 100 may include a DC-DC converter. The DC-DC converter may be a low dropout (LDO) DC-DC converter, a buck DC-DC converter, a boost DC-DC converter or a buck boost DC-DC converter. The DC-DC converter functions to convert the supply voltage VB1 to the supply voltage APT1 and adjust voltage level of the supply voltage APT1 based on the control signal ap1.

The processing circuit 200, which may be referred to as "the second processing circuit", serves to provide the supply voltage AET1 according to the control signal ev1 and the supply voltage VB1. Similar to the processing circuit 100, the processing circuit 200 may also include a DC-DC converter functioning to convert the supply voltage VB1 to the supply voltage AET1. The DC-DC converter of the processing circuit 200 may be a LDO DC-DC converter, a buck DC-DC converter, a boost DC-DC converter or a buck boost DC-DC converter. Furthermore, the processing circuit 200 adjusts the supply voltage AET1 according to the control signal ev1 with the ETSM mechanism.

The PA 2000 includes a driving stage 700 and an output stage 800. The driving stage 700 includes at least one amplifier, e.g., the driving stage amplifier 700-1 to 700-*n*. The driving stage amplifiers 700-1 to 700-*n* are coupled to a supply port Vcc1, and the supply port Vcc1 is coupled to the processing circuit 100 to receive the supply voltage APT1. The PA 2000 may have an internally parasitic capacitance C1, which may be measured on a connecting path P1 between the supply port Vcc1 and the driving stage amplifiers 700-1 to 700-*n*. The supply port Vcc1 may be referred to as "the first supply port", and the capacitance C1 may be referred to as "the first equivalent capacitance", and the capacitance C1 is related to the supply port Vcc1.

The output stage 800 includes an output stage amplifier 800-1. The output stage amplifier 800-1 receives the supply voltage AET1 through a supply port Vcc2. The supply port Vcc2, which may be referred to as "the second supply port", is coupled to the processing circuit 200 to receive the supply voltage AET1. Another capacitance C2 internally parasitic in the PA 2000 may be measured on a connecting path P2 between the supply port Vcc2 and the output stage amplifiers 800-1. The capacitance C2, which may be referred to as "the second equivalent capacitance", is related to the supply port Vcc2.

Furthermore, an external parasitic capacitance C3 which is exterior to the PA 2000, may be measured on a connecting path P3 between the supply port Vcc2 and the processing circuit 200. The capacitance C3 may be identified at a location exterior to the PA 2000 and near the supply port Vcc2. The capacitance C3 is also related to the supply port Vcc2 and may be referred to as "the third equivalent capacitance".

Moreover, a capacitance C4 and an inductance L1 may be also measured on the connecting path P3 between the supply port Vcc2 and the processing circuit 200. The capacitance C4 and the inductance L1 are related to a routing wire of a circuit board which forms the connecting path P3 between the supply port Vcc2 and the processing circuit 200. The capacitance C4 may be referred to as the "fourth equivalent capacitance".

Base on the aforementioned configuration of the voltage control device 1000 and the PA 2000, the capacitances C2, C3 and C4 are formed in a parallel manner with respect to the connecting paths P3 and P2. Hence, when observing from the processing circuit 200 to the output stage amplifier 800-1 through the connecting paths P3, the supply port Vcc2 and the connecting path P2, an total equivalent capacitance Ct may be obtained as a sum of the capacitances C2, C3 and C4 as equation (1):

$$Ct=C2+C3+C4 \qquad \text{eq. (1)}$$

Furthermore, the supply voltage AET1 has a signal bandwidth BW1 related to total equivalent capacitance Ct. The smaller value of the total equivalent capacitance Ct may result in greater signal bandwidth BW1 for the supply voltage AET1. With the greater signal bandwidth BW1, the PA 2000 may achieve better linearity and suffer less distortion, and the RF signal rs2 may hence achieve better signal integrity.

Figure 5:
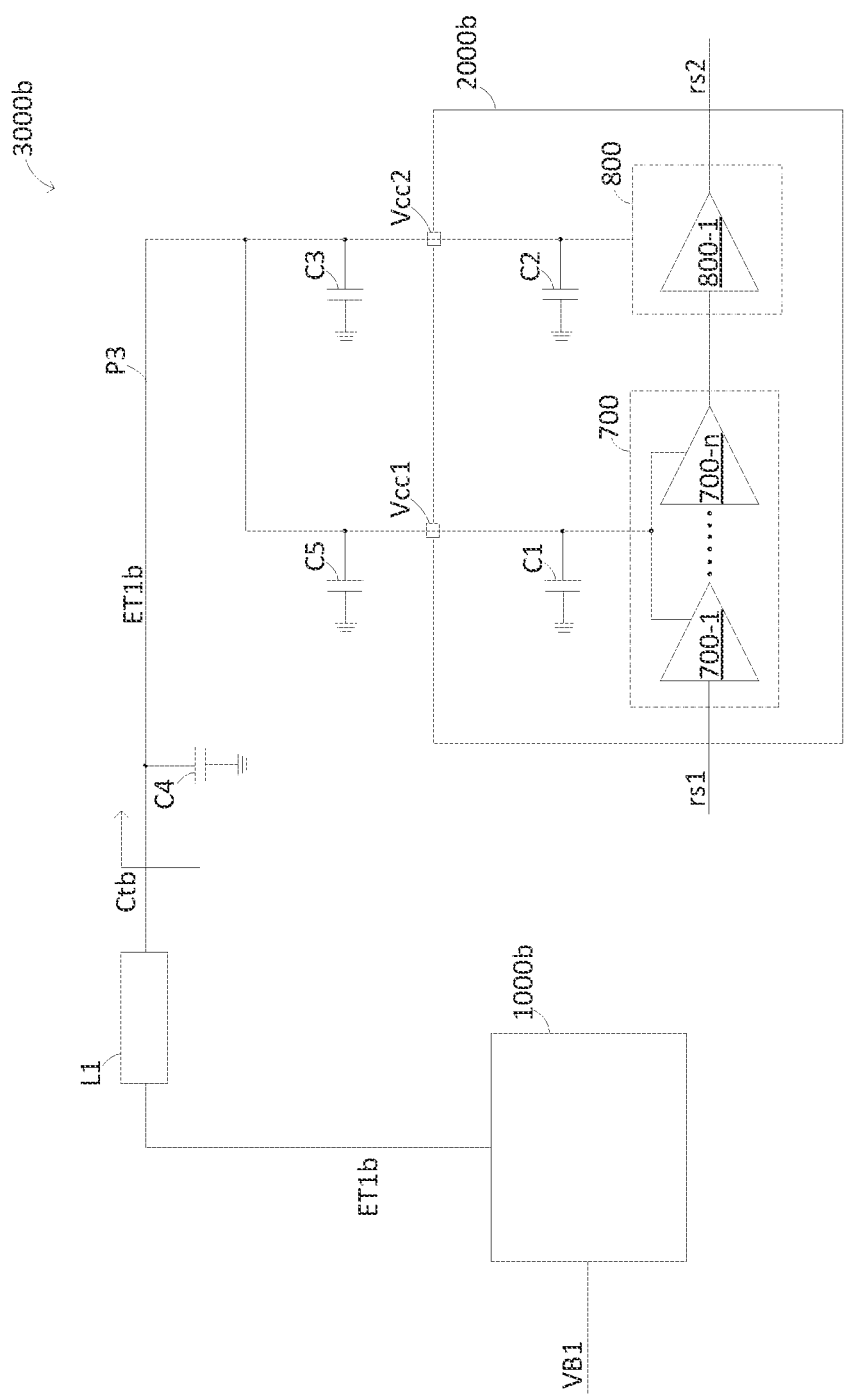
FIG. 5 is a schematic block diagram illustrating a voltage control device and a PA of a TX front end in a comparative example.

FIG. 5 is a schematic block diagram illustrating a voltage control device 1000b and a PA 2000b of a TX front end 3000b in a comparative example. Referring to FIG. 5, the voltage control device 1000b merely provides one supply voltage ET1b to the PA 2000b. The driving stage amplifiers 700-1 to 700-n receives the supply voltage ET1b through the supply port Vcc1, and the output stage amplifier 800-1 receives the supply voltage ET1b through the supply port Vcc2. Capacitances C1 and C5 related to the supply port Vcc1 may be measured, where the capacitance C1 is internally parasitic to the PA 2000b and the capacitance C5 is exterior to the PA 2000b. Likewise, capacitances C3 and C2 related to the supply port Vcc2 may be measured, where the capacitance C2 is internally parasitic to the PA 2000b and the capacitance C3 is exterior to the PA 2000b. Furthermore, the capacitance C4 may be measured on the routing wire of the circuit board forming the connecting path P3. Since the supply voltage ET1b is provided to the driving stage amplifiers 700-1 to 700-n and the output stage amplifier 800-1 through the supply ports Vcc1 and Vcc2, the total equivalent capacitance Ctb related to the supply voltage ET1b may be obtained as a sum of the capacitances C1, C5, C2, C3 and C4 as equation (2):

$$Ct=C1+C5+C2+C3+C4 \qquad \text{eq. (2)}$$

Compared with the total equivalent capacitance Ctb of the comparative example of FIG. 5, the voltage control device 1000 of the present disclosure shown in FIG. 4 may provide smaller value of total equivalent capacitance Ct. Hence, the voltage control device 1000 of FIG. 4 may achieve wider signal bandwidth BW1 for the supply voltage AET1.

Figure 6:
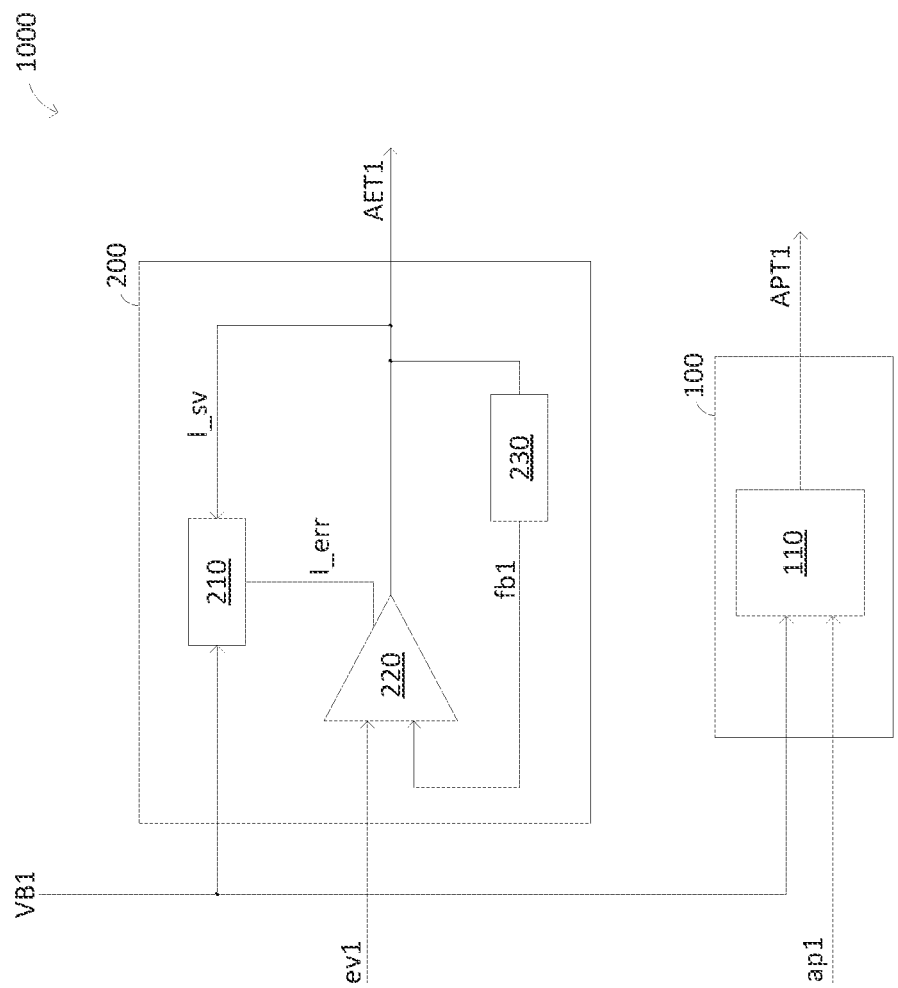
FIG. 6 is a schematic block diagram of one example of the voltage control device of FIG. 4.

FIG. 6 is a schematic block diagram of one example of the voltage control device 1000 of FIG. 4. Referring to FIG. 6, the processing circuit 200 (i.e., the second processing circuit) of the voltage control device 1000 may include a converter 210, an amplifier 220 and a feedback circuit 230. The converter 210 may be a DC-DC converter (e.g., a LDO DC-DC converter, a buck DC-DC converter, a boost DC-DC converter or a buck boost DC-DC converter) serving to convert the supply voltage VB1 to the supply voltage AET1. The amplifier 220, which is an analog differential amplifier (e.g., an "OP Amp"), may function as an error amplifier to provide an error current I_err to the converter 210. The error current I_err is generated based on the control signal ev1 and a feedback signal fb1, and the feedback circuit 230 serves to provide the feedback signal fb1 based on the supply voltage AET1. When the voltage level of the supply voltage AET1 departs from the control signal ev1 (i.e., the voltage level of the supply voltage AET1 departs from the envelope 30 of the RF signal rs2), the error current I_err may have a larger current value, and the converter 210 may sink or source a control current I_sv to adjust voltage level of the supply voltage AET1.

The processing circuit 100 (i.e., the first processing circuit) of the voltage control device 1000 may include a converter 110. Similar to the converter 210 of the processing circuit 200, the converter 110 may also be a DC-DC converter (e.g., a LDO DC-DC converter, a buck DC-DC converter, a boost DC-DC converter or a buck boost DC-DC converter) serving to convert the supply voltage VB1 to the supply voltage APT1. Furthermore, the converter 110 is configured to adjust the supply voltage APT1 based on the control signal ap1, so that the voltage level of the supply voltage APT1 may approximately fit the average power level 20 of the RF signal rs2.

Figure 7A:
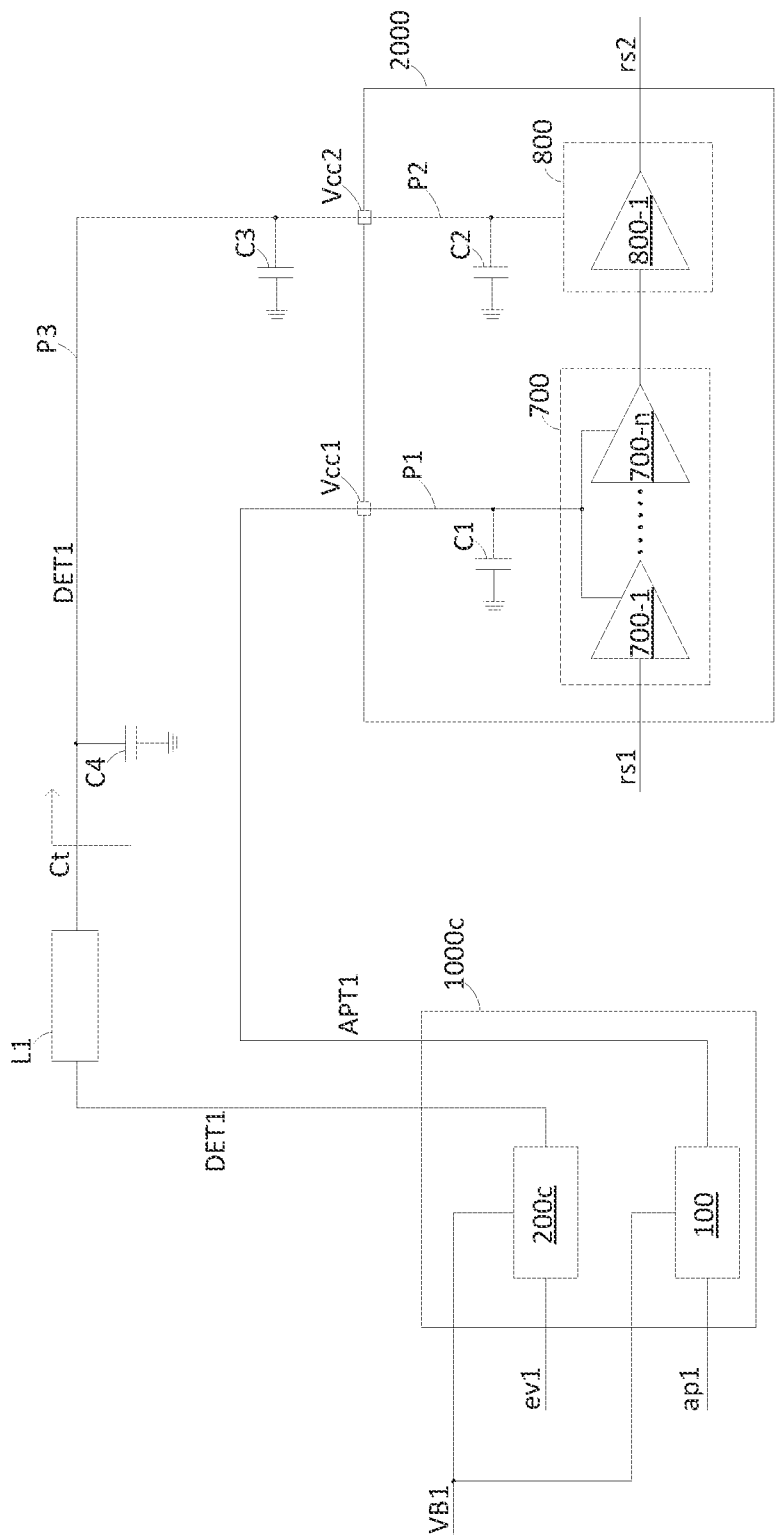
FIG. 7A is a schematic block diagram illustrating another example of voltage control device and the PA of the present disclosure.

FIG. 7A is a schematic block diagram illustrating another example of voltage control device 1000c and the PA 2000 of the present disclosure. Referring to FIG. 7A, the voltage control device 1000c is similar to the voltage control device 1000 of FIG. 4 except that, the voltage control device 1000c provides a supply voltage DET1 of digital type. The processing circuit 200c of the voltage control device 1000c may have a circuit capable of processing mixed signal, so that the supply voltage DET1 may be generated as a digital modulated supply voltage according to the ETSM mechanism.

Figure 7B:
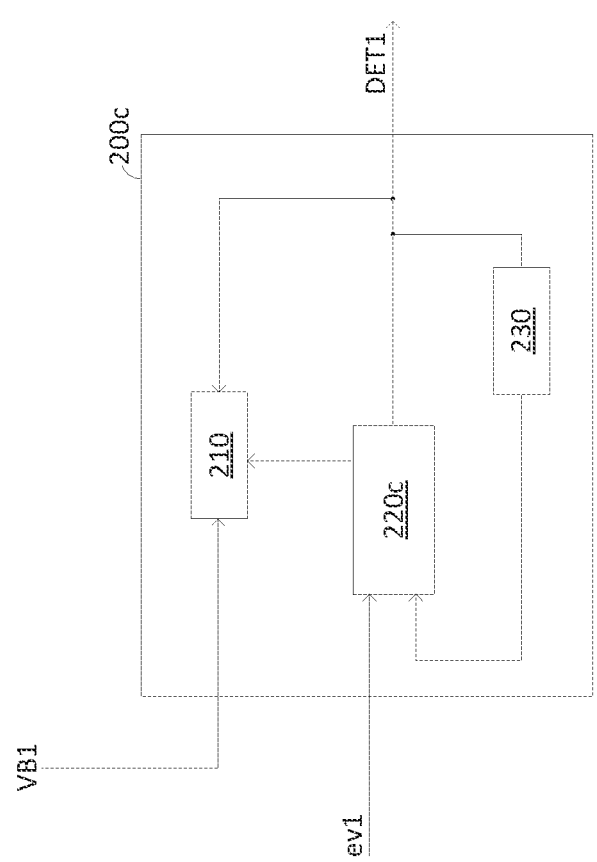
FIG. 7B is a schematic block diagram of the processing circuit of FIG. 7A.

FIG. 7B is a schematic block diagram of the processing circuit 200c of FIG. 7A. Referring to FIG. 7A, the processing circuit 200c is similar to the processing circuit 200 of FIG. 6 except that, the amplifier 220 (i.e., an analog differential amplifier) of FIG. 6 may be replaced by a mixed-signal circuit 220c. The mixed-signal circuit 220c serves to estimate an error value between the control signal ev1 and the supply voltage DET1. With aid of the error value, the converter 210c may adjust the supply voltage DET1 as a desired voltage level to fit the envelope 30 of the RF signal rs2, and ETSM mechanism is achieved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A voltage control device for controlling supply voltages of a power amplifier (PA), the voltage control device comprising:
    a first processing circuit, configured to provide a first supply voltage to at least one driving stage amplifier of the PA, the first processing circuit comprising:
    a low dropout (LDO) DC-DC converter, a buck DC-DC converter, a boost DC-DC converter or a buck boost DC-DC converter
    a second processing circuit, configured to provide a second supply voltage to an output stage amplifier of the PA;
    wherein the first supply voltage is generated according to an average-power-tracking (APT) mechanism related to an average power level of a radio frequency (RF) signal transmitted by the PA.

2. The voltage control device according to claim 1, wherein the first processing circuit receives a fixed supply voltage from a power source and convert the fixed supply voltage to the first supply voltage according to the APT mechanism.

3. The voltage control device according to claim 1, wherein the first supply voltage is provided to the at least one driving stage amplifier through a first supply port, the PA has a first equivalent capacitance which is internally parasitic in the PA, and the first equivalent capacitance is related to the first supply port.

4. The voltage control device according to claim 1, wherein the second supply voltage is generated according to an envelope-tracking-supply-modulation (ETSM) mechanism related to an envelope of the voltage level of the RF signal transmitted by the PA.

5. The voltage control device according to claim 4, wherein the second processing circuit comprises an analog differential amplifier, and the second supply voltage is an analog modulated supply voltage generated according to the ETSM mechanism.

6. The voltage control device according to claim 4, wherein the second processing circuit comprises a mixed-signal circuit, and the second supply voltage is a digital modulated supply voltage generated according to the ETSM mechanism.

7. The voltage control device according to claim 1, wherein the second supply voltage is provided to the output stage amplifier through a second supply port, the PA has a second equivalent capacitance which is internally parasitic in the PA, and the second equivalent capacitance is related to the second supply port.

8. The voltage control device according to claim 7, wherein the second supply port is further related to a third equivalent capacitance, and the third equivalent capacitance is exterior to the PA.

9. The voltage control device according to claim 8, wherein a connecting path between the second supply port and the second processing circuit has a fourth equivalent capacitance, and the second supply voltage has a signal bandwidth related to the sum of the second equivalent capacitance, the third equivalent capacitance and the fourth equivalent capacitance.

10. A power amplifying system, comprising:
a power amplifier, comprising:
at least one driving stage amplifier; and
an output stage amplifier;
a first processing circuit, configured to generate a first supply voltage according to an average-power-tracking (APT) mechanism, and provide the first supply voltage to the at least one driving stage amplifier, the first processing circuit comprising:
a low dropout (LDO) DC-DC converter, a buck DC-DC converter, a boost DC-DC converter or a buck boost DC-DC converter,
a second processing circuit, configured to generate a second supply voltage according to an envelope-tracking-supply-modulation (ETSM) mechanism, and provide the second supply voltage to the output stage amplifier.

11. The power amplifying system according to claim 10, wherein the first supply voltage is related to an average power level of a radio frequency (RF) signal transmitted by the PA.

12. The power amplifying system according to claim 10, further comprising:
a power source, configured to provide a fixed supply voltage to the first processing circuit;
wherein the first processing circuit converts the fixed supply voltage to the first supply voltage according to the APT mechanism.

13. The power amplifying system according to claim 10, further comprising:
a first supply port, connected between the first processing circuit and the at least one driving stage amplifier to transmit the first supply voltage;
wherein the PA has a first equivalent capacitance which is internally parasitic in the PA, and the first equivalent capacitance is related to the first supply port.

14. The power amplifying system according to claim 10, wherein the second supply voltage is related to an envelope of the voltage level of the RF signal transmitted by the PA.

15. The power amplifying system according to claim 14, wherein the second supply voltage is an analog modulated supply voltage or a digital modulated supply voltage generated according to the ETSM mechanism.

16. The power amplifying system according to claim 10, further comprising:
a second supply port, connected between the second processing circuit and the output stage amplifier to transmit the second supply voltage;
wherein the PA has a second equivalent capacitance which is internally parasitic in the PA, and the second equivalent capacitance is related to the second supply port.

17. The power amplifying system according to claim 16, wherein the second supply port is further related to a third equivalent capacitance, and the third equivalent capacitance is exterior to the PA.

18. The power amplifying system according to claim 17, further comprising:
a connecting path, connected between the second supply port and the second processing circuit, the connecting path has a fourth equivalent capacitance;
wherein the second supply voltage has a signal bandwidth related to the sum of the second equivalent capacitance, the third equivalent capacitance and the fourth equivalent capacitance.

* * * * *